(12) United States Patent
Impala' et al.

(10) Patent No.: US 12,322,447 B2
(45) Date of Patent: Jun. 3, 2025

(54) APPARATUS WITH MULTI-BIT CELL READ MECHANISM AND METHODS FOR OPERATING THE SAME

(71) Applicant: Micron Technology, Inc., Boise, ID (US)

(72) Inventors: Matteo Impala', Milan (IT); Mattia Robustelli, Milan (IT); Innocenzo Tortorelli, Milan (IT)

(73) Assignee: Micron Technology, Inc., Boise, ID (US)

( * ) Notice: Subject to any disclaimer, the term of this patent is extended or adjusted under 35 U.S.C. 154(b) by 201 days.

(21) Appl. No.: 17/970,315

(22) Filed: Oct. 20, 2022

(65) Prior Publication Data

US 2024/0135996 A1 Apr. 25, 2024
US 2024/0233828 A9 Jul. 11, 2024

(51) Int. Cl.
*G11C 16/10* (2006.01)
*G11C 16/26* (2006.01)
*G11C 16/34* (2006.01)

(52) U.S. Cl.
CPC ............ *G11C 16/102* (2013.01); *G11C 16/26* (2013.01); *G11C 16/3404* (2013.01)

(58) Field of Classification Search
CPC .................................................. G11C 13/004
See application file for complete search history.

(56) References Cited

U.S. PATENT DOCUMENTS

| 2015/0006997 A1* | 1/2015 | Alam | G06F 11/1048 |
| | | | 365/158 |
| 2020/0013454 A1* | 1/2020 | Tzoufras | H03K 19/0002 |
| 2022/0013167 A1* | 1/2022 | Robustelli | G11C 13/004 |

* cited by examiner

*Primary Examiner* — Douglas King
(74) *Attorney, Agent, or Firm* — Perkins Coie LLP

(57) ABSTRACT

Methods, apparatuses and systems related to reading data from memory cells configured to store more than one bit are described. The apparatus may be configured to determine a polarity data associated with reading data stored at a target location. In reading the data stored at the target location, the apparatus may apply one or more voltage levels across different polarities according to the determined polarity data.

17 Claims, 11 Drawing Sheets

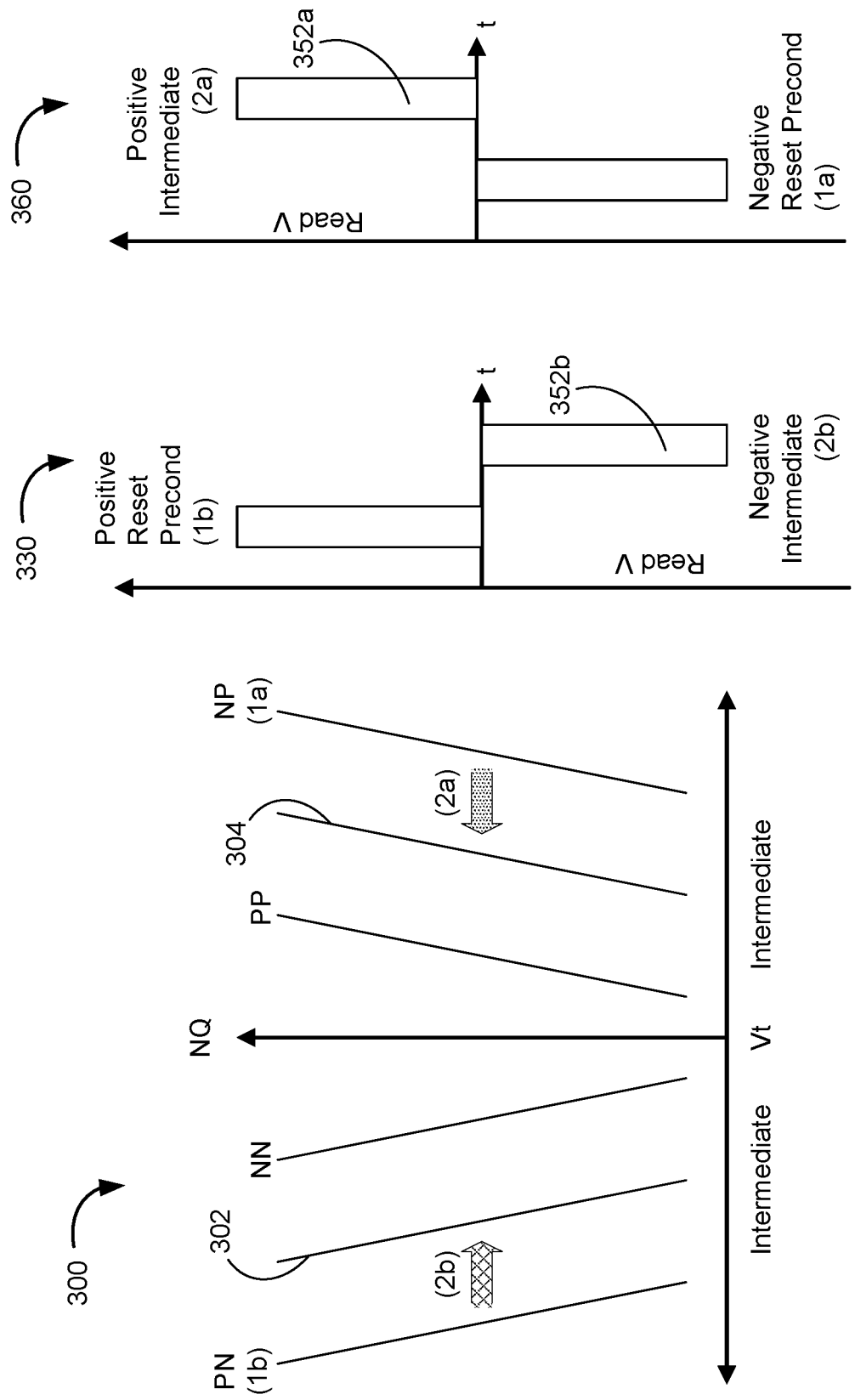

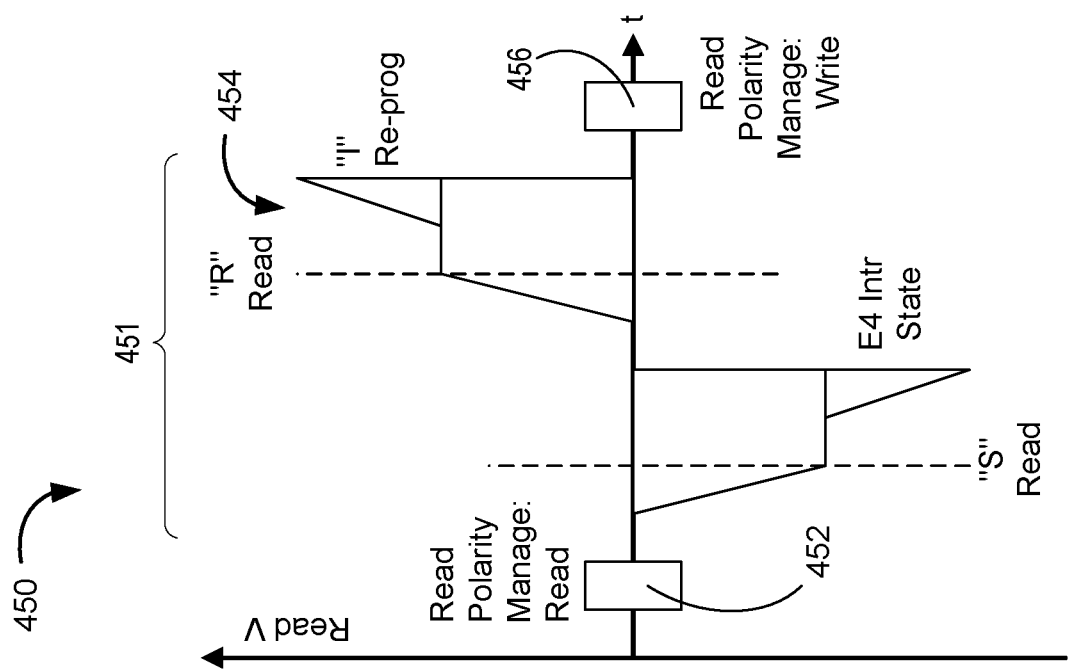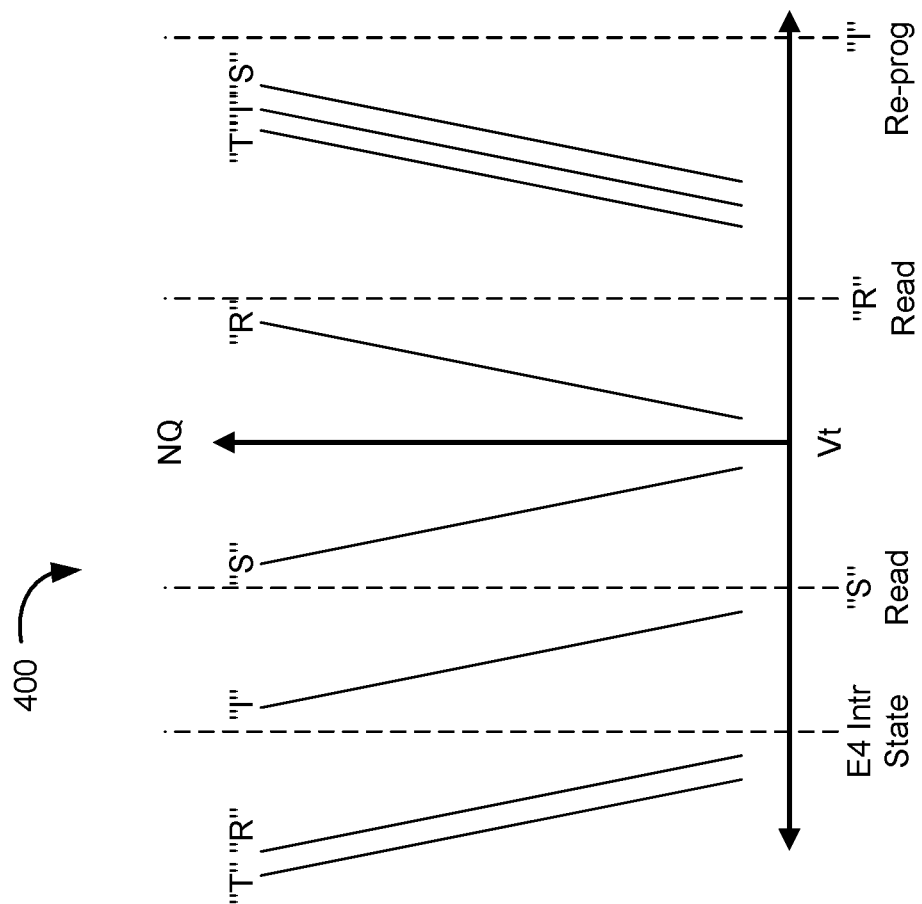
*FIG. 4B*
*FIG. 4A*

APPARATUS WITH MULTI-BIT CELL READ MECHANISM AND METHODS FOR OPERATING THE SAME

TECHNICAL FIELD

The disclosed embodiments relate to devices, and, in particular, to semiconductor memory devices with multi-bit cell read mechanism and methods for operating the same.

BACKGROUND

Memory systems can employ memory devices to store and access information. The memory devices can include volatile memory devices, non-volatile memory devices (e.g., flash memory employing "NAND" technology or logic gates, "NOR" technology or logic gates, or a combination thereof), or a combination device. The memory devices utilize electrical energy, along with corresponding threshold levels or processing/reading voltage levels, to store and access data. To improve the storage density, the memory systems can include circuit units or memory cells that can each store multiple bits. However, increasing the storage density often requires additional processing and/or circuits, which lead to increased power consumption and/or increased data access errors.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

FIGS. 3A-3C are illustrations of example programming operations for establishing the intermediate state of multi-bit cells in accordance with an embodiment of the present technology.

FIGS. 4A, 4B, 5A, and 5B are illustrations of a first adjusted read operation for multi-bit cells in accordance with an embodiment of the present technology.

DETAILED DESCRIPTION

As described in greater detail below, the technology disclosed herein relates to an apparatus, such as memory systems, systems with memory devices, related methods, etc., for accessing multi-bit cells. In addition to single-level cells (SLCs) having one bit-per-cell (BPC) capacity, the apparatus can include multi-bit cells having greater (e.g., two or more) BPC capacities. For example, multi-level cells (MLCs) can have 2 BPC capacity, triple-level cells (TLCs) can have 3 BPC capacity, quad-level cells (QLCs) can have 4 BPC, etc. The different BPC capacity can correspond to a set of resistance levels that each corresponds to a storage state or a unique combination of bit values. For example, the SLCs can have two states representative of a 0 value or a '1' value stored therein, the MLCs can have four states representative of 00, 01, 10, and 11, and so forth across a spectrum/range of resistance levels. As such, the storage states of multi-bit cells can include intermediate states corresponding to voltage/resistance levels with magnitude (s) less than one or more maximum magnitudes.

The apparatus can program the multi-bit cells with the intermediate states by establishing the maximum magnitude (e.g., maximum resistance levels) using an initial pulse and then decreasing the resistance using an opposite polarity pulse. In reading the multi-bit cells, the apparatus can use/apply different read voltages to determine the established resistance or threshold voltage (Vt). When the multi-bit cell is in the intermediate storage state, the application of different read voltages may inadvertently alter the initially established intermediate resistance. As such, the apparatus can adjust the resistance level, such as by applying an offsetting pulse, to reestablish the intermediate state at the end of the read operation.

Embodiments of the present technology can include leveraging the read voltages to both/simultaneously read the multi-bit cells and reprogram the intermediate state. For each read operation, the apparatus can determine a polarity that corresponds to a read sequence. The apparatus can adjust a sequence for applying the read voltages according to the polarity such that a final application of the read voltage or the corresponding pulse can be used to adjust the established resistance and reestablish the intermediate state without a separate/dedicated reprogramming pulse. The adjusted sequence and the final read pulse can change or flip a polarity associated with the intermediate state. As such, the apparatus can use the final read pulse or a separate operation to adjust the polarity for a next read operation. Accordingly, the apparatus can use the adjustable read sequence to eliminate the separate/dedicated reprogramming pulse and reduce/eliminate the corresponding time and power consumption.

Example Environment

Figure 1:
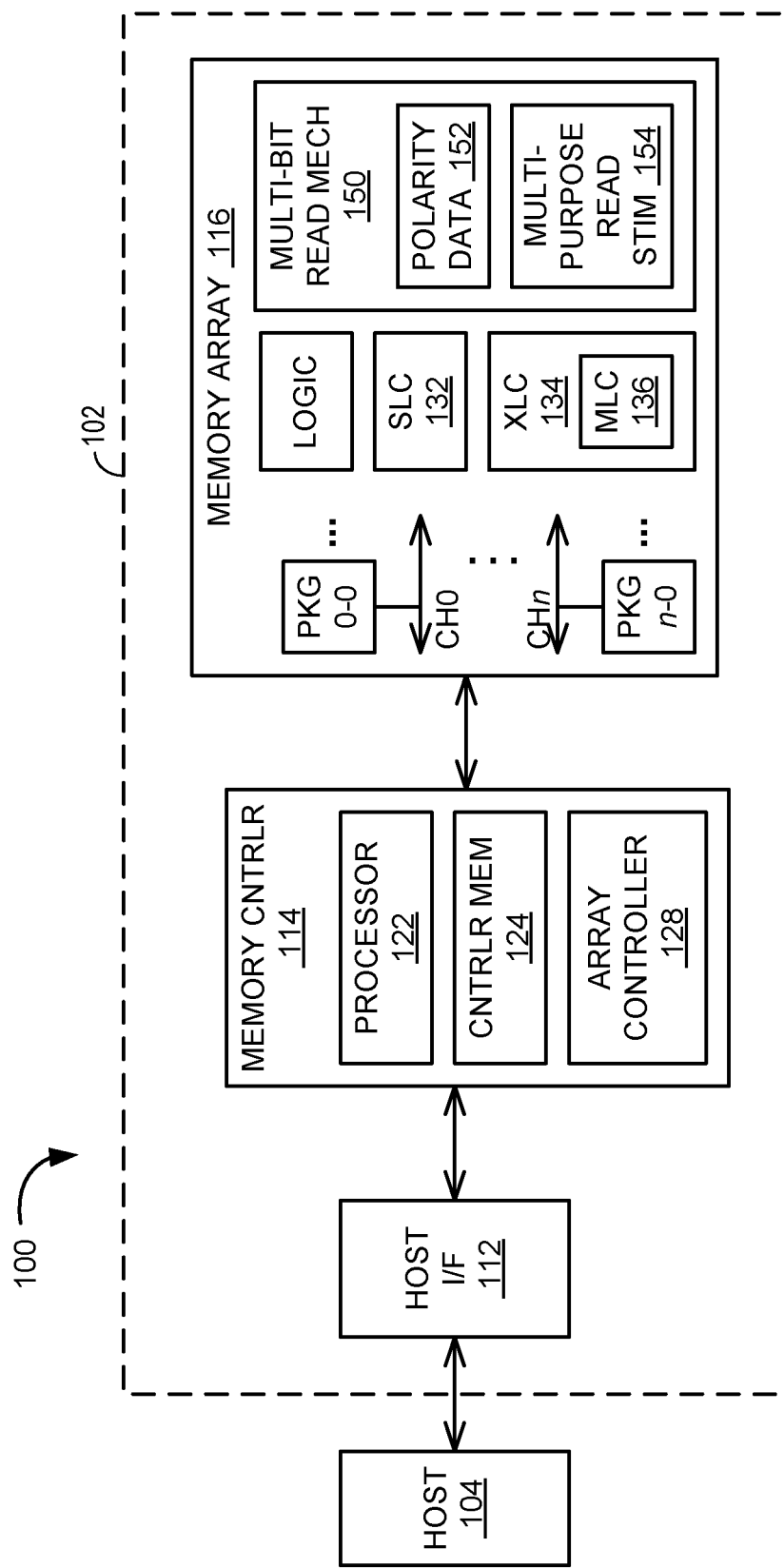
FIG. 1 is a block diagram of a computing system in accordance with an embodiment of the present technology.

FIG. 1 is a block diagram of a computing system 100 in accordance with an embodiment of the present technology. The computing system 100 can include a personal computing device/system, an enterprise system, a mobile device, a server system, a database system, a distributed computing system, or the like. The computing system 100 can include a memory system 102 coupled to a host device 104. The host device 104 can include one or more processors that can write data to and/or read data from the memory system 102. For example, the host device 104 can include an upstream central processing unit (CPU).

The memory system 102 can include circuitry configured to store data (via, e.g., write operations) and provide access to stored data (via, e.g., read operations). For example, the memory system 102 can include a persistent or non-volatile data storage system, such as a NAND-based Flash drive system, a Solid-State Drive (SSD) system, a SD card, or the like. In some embodiments, the memory system 102 can include a host interface 112 (e.g., buffers, transmitters, receivers, and/or the like) configured to facilitate communications with the host device 104. For example, the host interface 112 can be configured to support one or more host interconnect schemes, such as Universal Serial Bus (USB), Peripheral Component Interconnect (PCI), Serial AT Attachment (SATA), or the like. The host interface 112 can receive commands, addresses, data (e.g., write data), and/or other information from the host device 104. The host interface 112 can also send data (e.g., read data) and/or other information to the host device 104.

The memory system 102 can further include a memory controller 114 and a memory array 116. The memory array 116 can include memory cells that are configured to store a unit of information. The memory controller 114 can be configured to control the overall operation of the memory system 102, including the operations of the memory array 116.

The memory controller 114 can be configured to control the operations of the memory array 116. The memory controller 114 can include a processor 122, such as a microcontroller, special purpose logic circuitry (e.g., a field programmable gate array (FPGA), an application specific integrated circuit (ASIC), etc.), or other suitable processor. The processor 122 can execute instructions encoded in hardware, firmware, and/or software (e.g., instructions stored in controller-embedded memory 124) to execute various processes, logic flows, and routines for controlling operation of the memory system 102 and/or the memory array 116.

Further, the memory controller 114 can further include an array controller 128 that controls or oversees detailed or targeted aspects of operating the memory array 116. For example, the array controller 128 can provide a communication interface between the processor 122 and the memory array 116 (e.g., the components therein). The array controller 128 can function as a multiplexer/demultiplexer, such as for handling transport of data along serial connection to flash devices in the memory array 116.

In some embodiments, the memory array 116 can include a set of data storage devices or packages. Each of the packages can include a set of memory cells with each cell store data. The memory cells can include, for example, floating gate, charge trap, phase change, ferroelectric, magnetoresitive, and/or other suitable storage elements configured to store data persistently or semi-persistently. The memory cells can be one-transistor memory cells that can be programmed to a target state to represent information. For instance, memory cells can include variable resistance cells that store the data using different resistance levels. The resistance level of the memory cell can indicate a Vt of the cell. For example, SLCs 132 can be programmed to a targeted one of two different data states, which can be represented by the binary units 1 or 0. Also, some flash memory cells, such as multi-bit or extra-level cells (XLCs) 134 can be programmed to a targeted one of more than two data states. MLCs 136 may be programmed to any one of four data states (e.g., represented by the binary 00, 01, 10, 11) to store two bits of data. Similarly, TLCs may be programmed to one of eight (i.e., $2^3$) data states to store three bits of data, and QLCs may be programmed to one of 16 (i.e., $2^4$) data states to store four bits of data.

While the memory array 116 is described with respect to the memory cells, it is understood that the memory array 116 can include other components (not shown). For example, the memory array 116 can also include other circuit components, such as multiplexers, decoders, buffers, read/write drivers, address registers, data out/data in registers, etc., for accessing and/or programming (e.g., writing) the data and for other functionalities.

The memory system 102 can include, such as at the memory array 116, a multi-bit read mechanism 150 (e.g., a circuit, a set of software or firmware instructions, or a combination thereof) configured to leverage one or more aspects of a read operation to simultaneously detect the established resistance level and readjust/correct the resistance. For example, the memory system 102 can access polarity data 152 stored at a predetermined location such as a dedicated SLC cell or within a corresponding codeword, associated with the targeted read location. According to the accessed polarity data 152, the memory system 102 can adjust the read operation, such as by reordering and/or changing the polarity of one or more read voltages/pulses. For example, the memory system 102 can dynamically generate a multi-purpose read stimulus 154 with a setting (e.g., a pulse with a polarity and/or a magnitude) controlled according to the accessed polarity data 152. The memory system 102 can use the multi-purpose read stimulus 154 and/or a separate control to subsequently update the polarity data 152. Details regarding the multi-bit read mechanism 150 are described below.

Such memory cells may be arranged in rows (e.g., each corresponding to a word line) and columns (e.g., each corresponding to a bit line). The arrangements can further correspond to different groupings for the memory cells. For example, each word line can correspond to one or more memory pages. Also, the memory array 116 can include memory blocks that each include a set of memory pages. In operation, the data can be written or otherwise programmed (e.g., erased) with regards to the various memory regions of the memory array 116, such as by writing to groups of pages and/or memory blocks. In NAND-based memory, a write operation often includes programming the memory cells in selected memory pages with specific data values (e.g., a string of data bits having a value of either logic 0 or logic 1). An erase operation is similar to a write operation, except that the erase operation re-programs an entire memory block or multiple memory blocks to the same data state (e.g., logic 0).

Example Read Operation with Cell Reprogramming

Figure 2B:
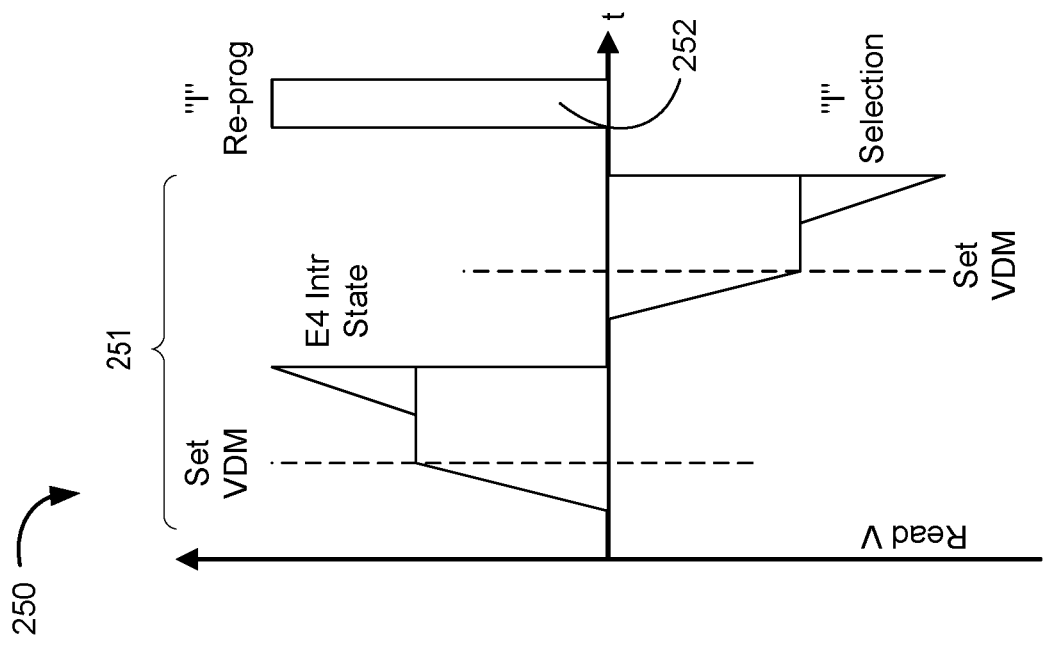
FIGS. 2A-2B are illustrations of an example read states for multi-bit cells and corresponding read operation that includes a separate and dedicated reprogramming pulse.
Figure 2A:
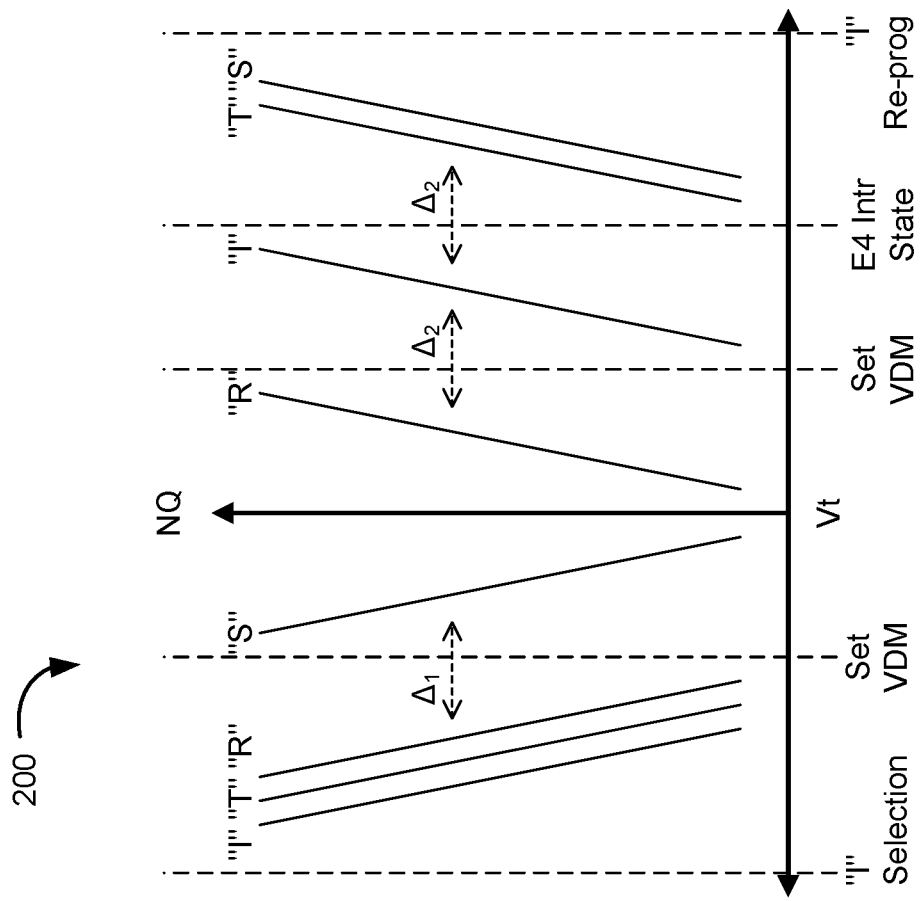

FIGS. 2A-2B are illustrations of an example read states and corresponding operation for multi-bit cells that includes a separate and dedicated reprogramming pulse. FIG. 2A illustrates threshold voltages 200 that correspond to a set of read states for the multi-bit cells (e.g., the XLC 134 of FIG. 1, such as the MLC 136 of FIG. 1). For example, the MLC 136 can be configured to use four read states, such as a Reset state (R), a Ternary state (T), a Set state (S), and an Intermediate (I) state, that correspond to different threshold voltage combinations for the memory cell. The T state can correspond to having high Vt in both polarities while the I state corresponds to having an intermediate Vt in one or more polarities. Given the four read states, a read sequence that checks for the various combinations can result in altering or destroying the intermediate Vt, such as to distinguish between the I state and the T state. Thus, the read sequence may be required to reestablish the intermediate Vt to preserve the read data.

The intermediate state can be represented using the established resistance levels in the memory cells. Each of the memory cells can correspond to different polarities or current flow directions, and the intermediate state can be placed in both polarities. For the intermediate state, one polarity or one of the memory cells can establish a resistance level between predetermined low and high levels, and the other polarity/memory cell can establish at a high resistance level. For the example illustrated in FIG. 2A, the negative polarity can have a high level that exceed a negative voltage demarcation (VDM) but less than the intermediate selection voltage (e.g., 6.5V). The intermediate state can be separated by a first separation range (Ai), such as 1.4V, from a low magnitude or set state. The positive polarity can have an intermediate level that exceeds a positive VDM but less than an intermediate threshold (E4 intermediate state). The positive intermediate magnitude can be separated by a second separation range ($\Delta_2$), such as around 0.8V, from the low magnitude or reset state and a high magnitude or terminal/set state.

FIG. 2B illustrates an example read sequence 250 that corresponds to the threshold voltages 200. The memory system 102 of FIG. 1 (e.g., the memory array 116 of FIG. 1) can use the read sequence 250 to identify the established resistance level, thereby reading the combination of bits stored in the memory cells.

For the illustrated example, the read sequence 250 can include a detection portion 251 that applies a first read voltage (e.g., the positive VDM) and then a corresponding intermediate read voltage (e.g., the voltage corresponding to the E4 intermediate state) for a first polarity. Following the first polarity operations, the detection portion 251 can include applying a second read voltage (e.g., the negative VDM) for a second polarity.

The application of the higher magnitude read voltage, such as the corresponding intermediate read voltages, can effectively alter the intermediate level. In other words, reading the memory cells can cause the resistance level to shift and change from the intermediate state to another state (e.g., the reset or the set state) by the end of the read. As such, after the detection portion 251, the read sequence 250 can include an intermediate selection voltage along the same direction (e.g., negative) followed by a reprogramming pulse 252 to reestablish the intermediate state for the corresponding cells. The reprogramming pulse 252 can include an application of voltage, current, and/or power at a previously accessed or read cell to reestablish the resistance level at the accessed/read cell. With the reprogramming pulse 252, the read sequence 250 can include two polarity changes. The first polarity change can occur during the detection portion 251, and the second change can be between the detection portion and the reprogramming pulse 252.

The I selection and the reprogramming pulse 252 can correspond to the programming operation that establishes the intermediate state. FIGS. 3A-3C are illustrations of example programming (e.g., write) operations for establishing the intermediate state of multi-bit cells (e.g., the XLCs 134 of FIG. 1) in accordance with an embodiment of the present technology. FIG. 3A can illustrate example Vt distributions 300 in the XLCs 134 for the programming operations. FIG. 3B can illustrate a first programming sequence 330 that establishes an intermediate state on the negative side of FIG. 3A, and FIG. 3C can illustrate a second programing sequence 360 that establishes an intermediate state on the positive side of FIG. 3A.

Referring now to FIGS. 3A-3C together, the memory system 102 of FIG. 1 can program a first intermediate state 302, such as for an intermediate state on the negative side, and a second intermediate state 304, such as for an intermediate state on the positive side. The first intermediate state 302 can be between two end states on one polarity (e.g., negative polarity), and the second intermediate state 304 can be between two end states on an opposite polarity (e.g., positive polarity). For example, the first intermediate state 302 can be between (1) a high-negative Vt state corresponding to positive-pulse negative-read (PN) and (2) a low-negative Vt state corresponding to negative-pulse negative-read (NN). As such, the memory system 102 can establish the first intermediate state 402 using the first programming sequence 330, which includes (1b) a positive reset preconditioning pulse that pulls the Vt to the PN state and (2b) a negative intermediate pulse 352b to reduce the magnitude of the Vt. Also, for example, the second intermediate state 304 can be between (1) a high-positive Vt state corresponding to negative-pulse positive-read (NP) and (2) a low-positive Vt state corresponding to positive-pulse positive-read (PP). As such, the memory system 102 can establish the second intermediate state 304 using the second programming sequence 360, which includes (1a) a negative reset preconditioning pulse that pulls the Vt to the NP state and (2a) a positive intermediate pulse 352a to reduce the magnitude of the Vt.

The intermediate pulses 352a and 352b can be used to offset or reduce the resistance to reach the intermediate state. The reprogramming pulse 252 of FIG. 2B can serve the same purpose as the intermediate pulses 352a and 352b. Since the first portion of the read sequence 250 of FIG. 2B can effectively increase the resistance when reading the intermediate state (e.g., during the detection portion 251 of FIG. 2B), the reprogramming pulse 252 can be used to offset the increased resistance and return the storage cell to the intermediate state. In other words, the read sequence 250 can additionally include a portion of the programming operation (e.g., the intermediate pulses 352a and 352b) to preserve/return the storage state.

Example Read Operations without Cell Reprogramming

In some embodiments, the memory system 102 can be configured to use or reorganize different portions of the read operation to both detect the storage state and reestablish the intermediate state when the read cell was initially at the intermediate state. In other words, the memory system 102 can use a portion of a detection portion of the read operation to perform both the detection function and the reprogramming function, thereby reestablishing the intermediate state without a separate/additional reprogramming pulse 252 of FIG. 2B.

As an illustrative example, the memory system 102 can access the polarity data 152 of FIG. 1 for an initial read operation and then adjust/perform the read sequence according to the accessed polarity data 152. The adjusted read sequence can include a pulse (e.g., a voltage/power application at a terminal portion of the read operation) that performs a portion of the detection sequence while simultaneously reestablishing the intermediate state. The reestablished intermediate state can have an opposite polarity in comparison to the initially established and read intermediate state. Accordingly, the memory system 102 can update/adjust the polarity data 152 at the end of the initial read operation. Based on the updated polarity data 152, the memory system 102 can implement a next/subsequent read operation by adjusting the read sequence, such as by reversing the polarities in comparison to the preceding/initial read operation.

Figure 5B:
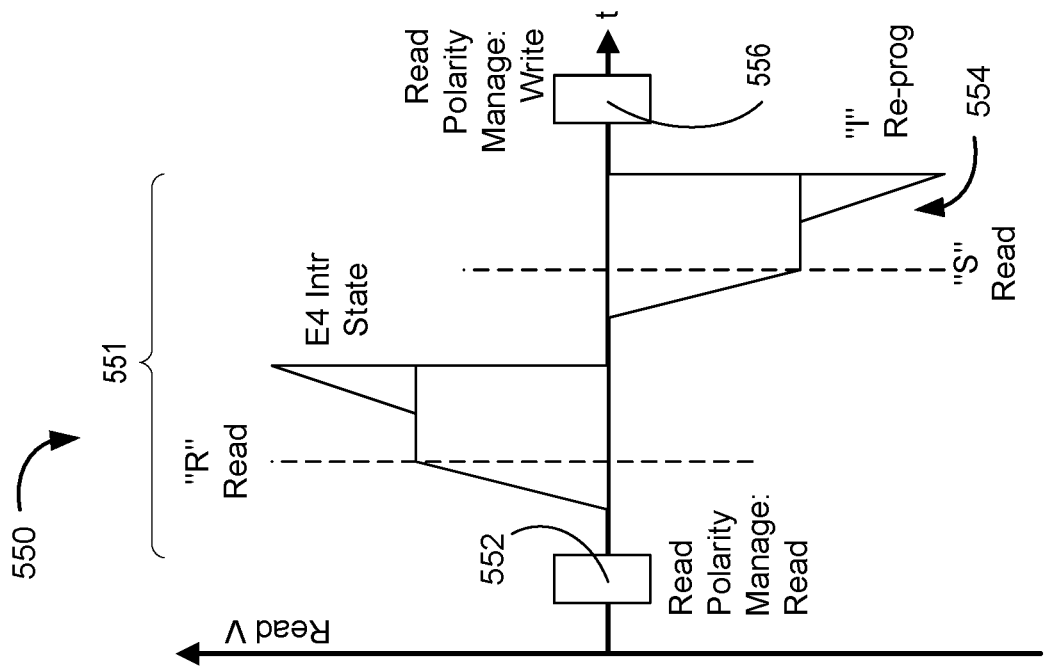
Figure 5A:
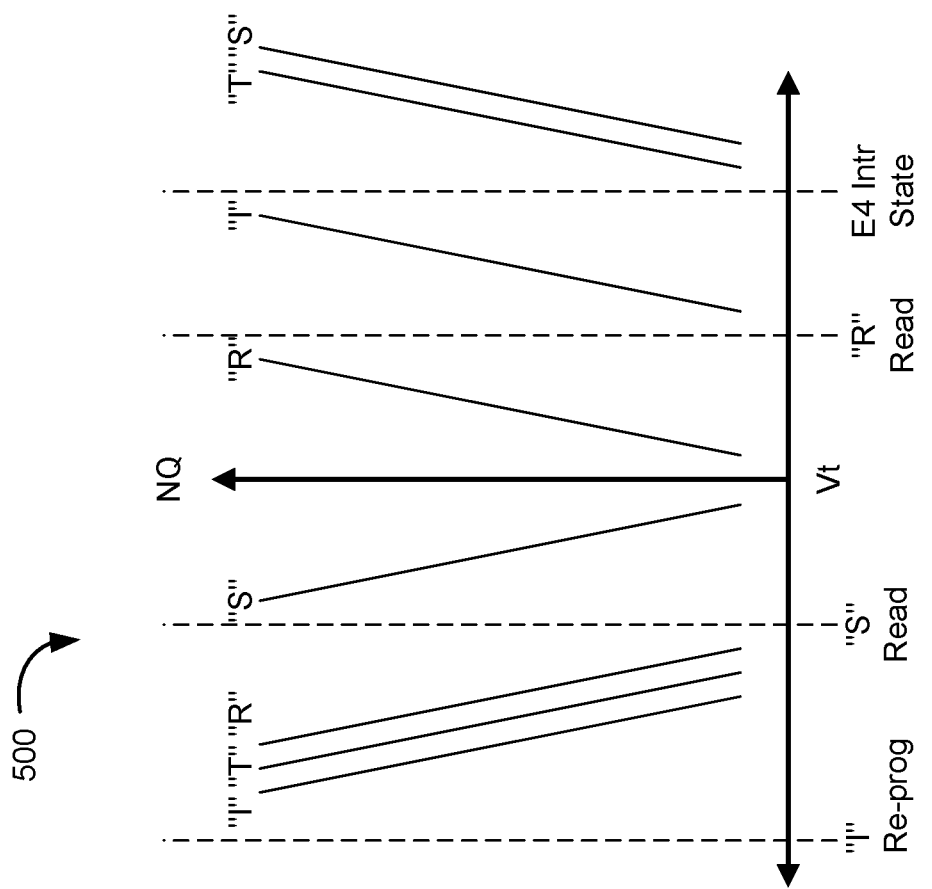

FIGS. 4A, 4B, 5A, and 5B are illustrations of a first adjusted read operation for multi-bit cells (e.g., the XLC 134 of FIG. 1, such as the MLC 136 of FIG. 1) in accordance with an embodiment of the present technology. FIG. 4A can illustrate a first set of Vt 400 for one or more read states corresponding to one aspect or portion (e.g., negative polarity read) of the first adjusted read operation, and FIG. 4B can illustrate a first example read sequence 450 that corresponds to the one aspect or portion of the first adjusted read operation. FIG. 5A can illustrate a second set of Vt 500 for one or more read states corresponding to another aspect or portion (e.g., a positive polarity read) of the first adjusted read operation, and FIG. 5B can illustrate a second example read sequence 550 that corresponds to the other aspect or portion of the first adjusted read operation. The first read sequence 450 and the second read sequence 550 can be complementary.

For the example illustrated in FIGS. 4A and 4B, the first read sequence 450 can include a polarity read 452 at a dedicated storage location (e.g., an instance of the SLC 132 of FIG. 1) configured to store the polarity data 152 of FIG. 1 for the target cell. The first read sequence 450 can correspond to a negative read polarity.

Based on the accessed polarity data 152, the memory system 102 can implement the first read sequence 450 having a detection portion 451 that first establishes (by, e.g., applying increasing levels of read voltages) read set (S) and then intermediate read state (E4) in negative polarity. In doing so, the initial portion of the first read sequence 450 can act as a first pulse (e.g., reset precondition 1*a* of FIG. 3C) corresponding to the intermediate state programming.

Subsequently, the detection portion 451 can include a polarity change for reading reset (R) state. The memory system 102 can apply/increase voltages on the positive side. After reading the R state, the first read sequence 450 can include a reprograming voltage 454 that matches the polarity (e.g., positive polarity) used for the R read. The reprograming voltage 454 can correspond to the intermediate/offsetting pulse. The reprograming voltage 454 can increase the applied voltage to a reprogramming level (e.g., 6.5V), which can be greater than the intermediate read voltage (e.g., magnitude of the intermediate read state). The reprograming voltage 454 (e.g., along with the R read) can function as the intermediate reprogramming pulse (e.g., intermediate pulse 2*a* of FIG. 3C) that establishes the intermediate state on the opposite (e.g., positive) polarity/side at the end of the first read sequence 450. The reprograming voltage 454 can have a controlled pulse width or ramp rate that corresponds to the Vt for the intermediate state.

To account for the polarity change, the memory system 102 can complete the first read sequence 450 by performing a polarity write 456 at the dedicated storage location. As such, the polarity data 152 can have different/opposite values before and after the first read sequence 450, thereby changing from the negative read intermediate state 302 of FIG. 3A to the positive read intermediate state 304 of FIG. 3A. Since the read result can be communicated after the R read, the reprograming voltage 454 can be implemented while or in parallel to sending out the read result (e.g., to the controller 114 of FIG. 1 and/or the host 104 of FIG. 1).

FIGS. 5A and 5B can illustrate an example that complements the example illustrated in FIGS. 4A and 4B. The second read sequence 550 can include a polarity read 552 at the dedicated storage location (e.g., an instance of the SLC 132 of FIG. 1), thereby accessing the different/updated value of the polarity data 152 than the polarity read 452. For example, the second read sequence 550 can correspond to a positive read polarity.

Based on the accessed polarity data 152, the memory system 102 can implement the second read sequence 550 having a detection portion 551 that first establishes (by, e.g., applying increasing levels of read voltages) "R" read and then intermediate read state (E4) in positive polarity. In doing so, the initial portion of the second read sequence 550 can act as a first pulse (e.g., reset preconditioning pulse 1*b* of FIG. 3B) corresponding to the intermediate state programming.

Subsequently, the detection portion 551 can include a polarity change for reading reset (R) state. The memory system 102 can apply/increase voltages for a negative read. After reading the R state, the second read sequence 550 can include a reprograming voltage 554 that matches the polarity (e.g., negative polarity) used for the "S" read. The reprograming voltage 554 can correspond to the intermediate/offsetting pulse. The reprograming voltage 554 can increase the applied voltage to a reprogramming level (e.g., 6.5V), which can be greater than the intermediate read voltage (e.g., magnitude of the intermediate read state). The reprograming voltage 554 (e.g., along with the R read) can function as the intermediate reprogramming pulse (e.g., the intermediate pulse 2*b* of FIG. 3B) that reprograms or reestablishes the intermediate state on the opposite (e.g., negative) polarity at the end of the second read sequence 550. The reprograming voltage 554 can have a controlled pulse width or ramp rate that corresponds to the Vt for the intermediate state.

To account for the polarity change, the memory system 102 can complete the second read sequence 550 by performing a polarity write 556 at the dedicated storage location. As such, the polarity data 152 can have different/opposite values before and after the second read sequence 550, thereby changing from the positive read intermediate state 302 of FIG. 3A to the negative read intermediate state 304 of FIG. 3A. Since the read result can be communicated after the R read, the reprograming voltage 554 can be implemented while or in parallel to sending out the read result (e.g., to the controller 102 of FIG. 1).

Figure 6:
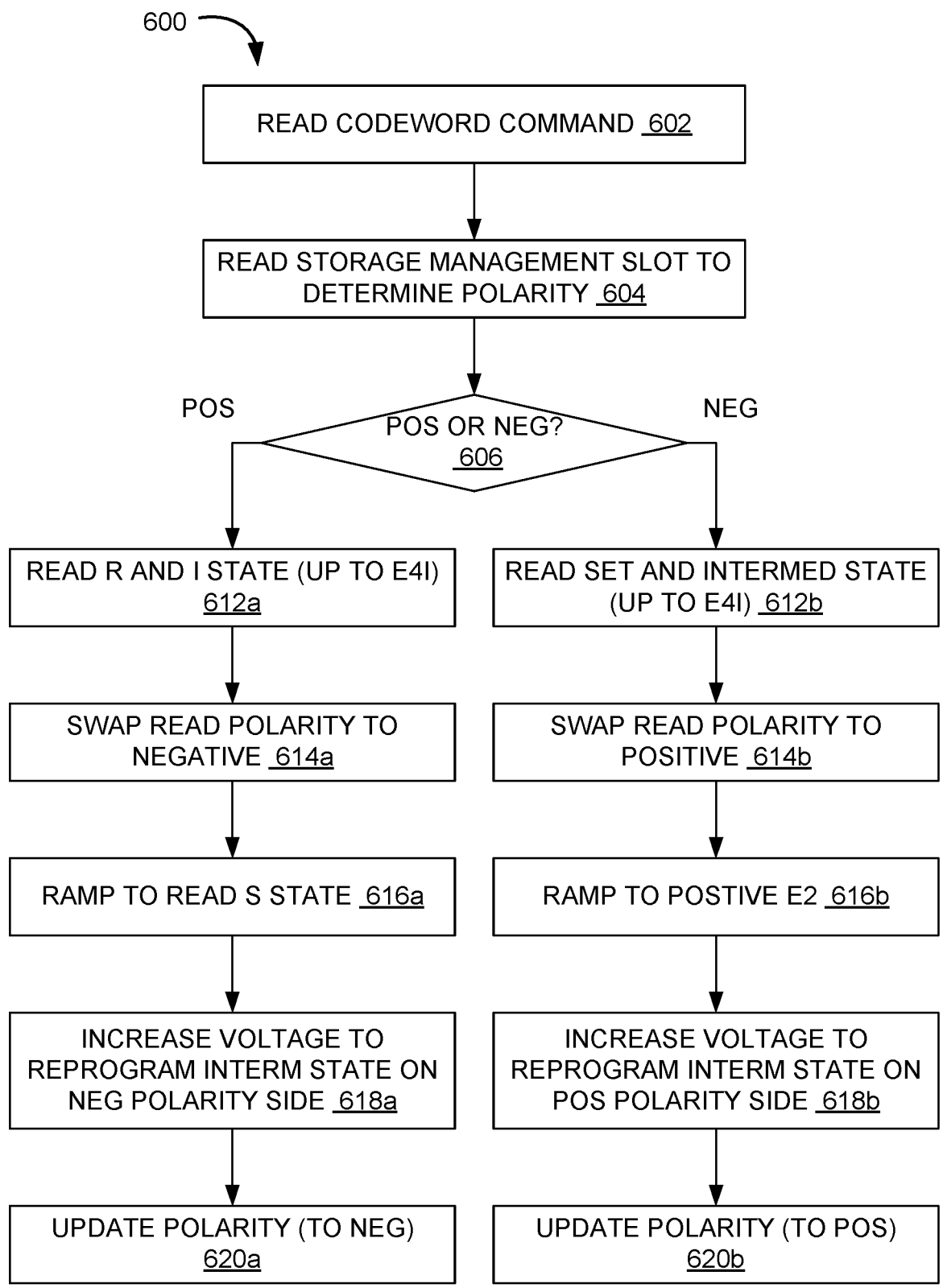
FIG. 6 is a flow diagram illustrating an example method corresponding to the first adjusted read operation in accordance with an embodiment of the present technology.

FIG. 6 is a flow diagram illustrating an example method 600 corresponding to the first adjusted read operation in accordance with an embodiment of the present technology. The method 600 can correspond to the multi-bit read mechanism 150 of FIG. 1. For example, the method 600 can represent the first read sequence 450 of FIG. 4B and the second read sequence 550 of FIG. 5B for the first adjusted read operation. The memory system 102 of FIG. 1 (e.g., the memory array 116 of FIG. 1) can implement the method 600 to read the XLC 134 of FIG. 1, such as the MLC 136 of FIG. 1.

At block 602, the memory system 102 can read a codeword command. For example, the memory system 102 (via, e.g., the memory array 116 and/or a processor or a logic circuit local thereto) can receive and process a codeword command, such as for reading a location (e.g., a set of one or more targeted memory cells) specified by the codeword command.

At block 604, the memory system 102 can read storage management slot to determine a polarity for the commanded read operation. For example, the memory array 116 can access the SLC 132 of FIG. 1 dedicated to storing the polarity data 152 of FIG. 1 for the targeted location. Accordingly, the memory array 116 can access the polarity data 152, such as described above for the polarity reads 452 of FIG. 4B and 552 of FIG. 5B.

At decision block 606, the memory system 102 can evaluate the accessed polarity data 152 to determine whether it indicates a positive read or a negative read. The memory system 102 can adjust the read sequence according to the polarity data 152. In some embodiments, the memory system 102 can adjust the read sequence to first establish the read states (by, e.g., increasing the read voltage) for or along the polarity indicated by the polarity data 152.

When the polarity data 152 indicates a positive read polarity, the memory system 102 can implement the operations represented in blocks 612a, 614a, 616a, 618a, and 620a that correspond to the second read sequence 550 of FIG. 5B. For example, the memory array 116 can implement the initial portion of the second read sequence 550 and establish the read set and intermediate state (e.g., up to the E4 intermediate read state) for positive polarity as illustrated at block 612a. At block 614a, the memory array 116 can swap the read polarity to negative. At block 616a, the memory array 116 can ramp the read voltage to the negative E2 state or S read state. At this point, the memory array 116 can identify the initial storage state of the targeted memory cell and communicate the read data. Subsequent to the R read and/or concurrent to the read data communication, the memory array 116 can further increase the voltage to reprogram the intermediate state on the negative polarity side as illustrated at block 618a. Accordingly, the memory array 116 can implement the reprograming voltage 554 of FIG. 5B using the same/positive polarity instead of using the separate/dedicated reprogramming pulse 252 of FIG. 2B (e.g., requiring an additional polarity change). To account for the reprogrammed intermediate state, the memory array 116 can update or change the polarity data 152 at the storage management slot, such as by changing the stored priority data 152 from positive to negative.

When the polarity data 152 indicates a negative read polarity, the memory system 102 can implement the operations represented in blocks 612b, 614b, 616b, 618b, and 620b that correspond to the first read sequence 450 of FIG. 4B. For example, the memory array 116 can implement the initial portion of the first read sequence 450 and establish the read set and intermediate state (e.g., up to the E4 intermediate read state) for negative polarity as illustrated at block 612b. At block 614b, the memory array 116 can swap the read polarity to positive. At block 616b, the memory array 116 can ramp the read voltage to the positive E2 state or R read state. At this point, the memory array 116 can identify the initial storage state of the targeted memory cell and communicate the read data. Subsequent to the R read and/or concurrent to the read data communication, the memory array 116 can further increase the voltage to reprogram the intermediate state on the positive polarity side as illustrated at block 618b. Accordingly, the memory array 116 can implement the reprograming voltage 454 of FIG. 4B using the same/positive polarity instead of using the separate/dedicated reprogramming pulse 252 (e.g., requiring an additional polarity change). To account for the reprogrammed intermediate state, the memory array 116 can update or change the polarity data 152 at the storage management slot, such as by changing the stored priority data 152 from negative to positive.

In comparison to the read sequence 250 of FIG. 2B, the memory system 102 (e.g., the memory array 116 of FIG. 1) can use the first adjusted read operation to detect the storage state and reestablish any intermediate states using one polarity change. For example, the memory system 102 can use the reprograming voltages 454 and 554 that maintain the same polarity as the preceding read, thereby eliminating the reprogramming pulse 252 and the corresponding polarity change. As such, the memory system 102 can use the first adjusted read operation to reduce the energy consumption and the latency in comparison to the read sequence 250.

FIGS. 7A, 7B, 8A, and 8B are illustrations of a second adjusted read operation for multi-bit cells (e.g., the XLC 134 of FIG. 1, such as the MLC 136 of FIG. 1) in accordance with an embodiment of the present technology.

Figure 7A:
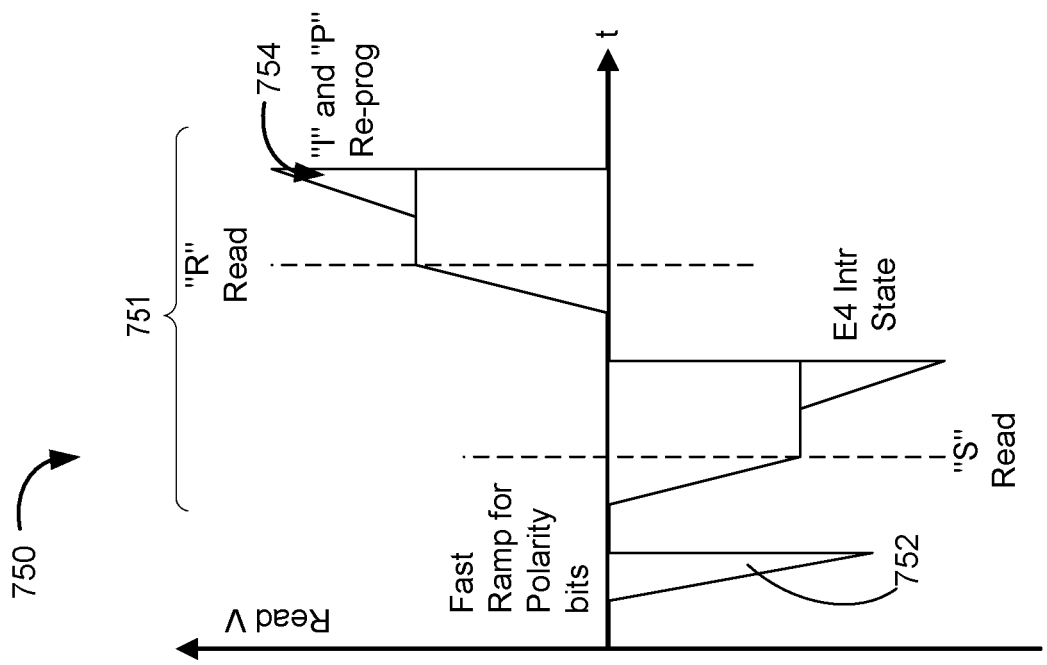
FIGS. 7A, 7B, 8A, and 8B are illustrations of a second adjusted read operation for multi-bit cells in accordance with an embodiment of the present technology.
Figure 7B:
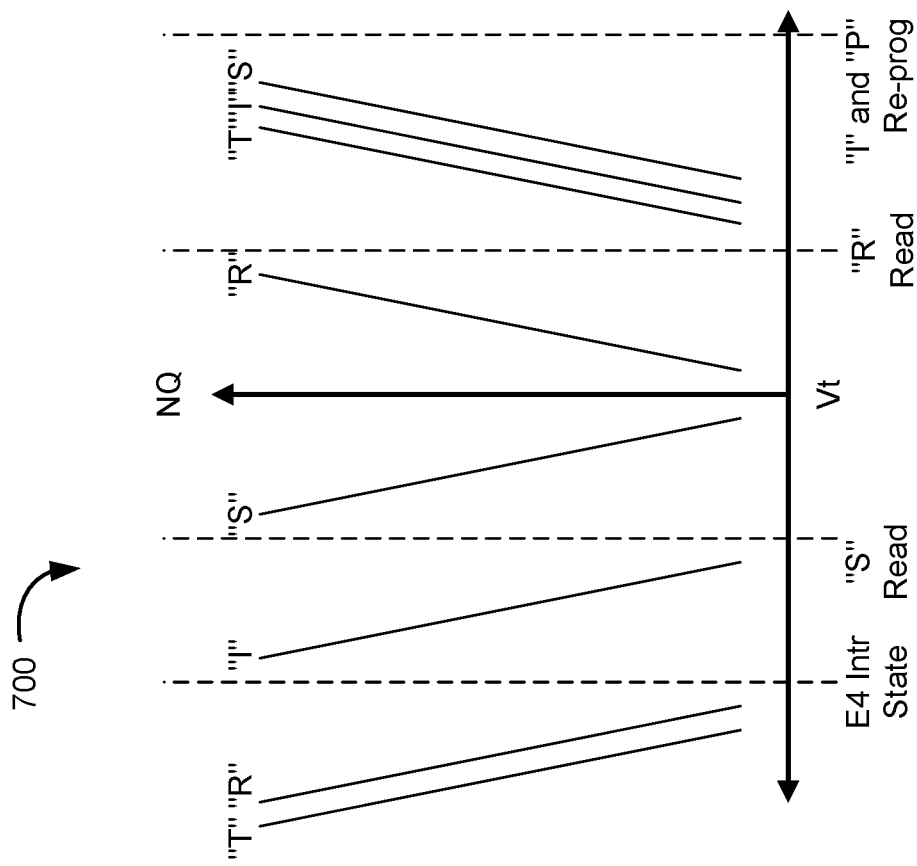

FIG. 7A can illustrate a first set of Vt 700 for one or more read states corresponding to one aspect or portion (e.g., negative polarity read) of the second adjusted read operation, and FIG. 7B can illustrate a first example read sequence 750 that corresponds to the one aspect or portion of the second adjusted read operation. FIG. 8A can illustrate a second set of Vt 800 for one or more read states corresponding to another aspect or portion (e.g., a positive polarity read) of the second adjusted read operation, and FIG. 5B can illustrate a second example read sequence 850 that corresponds to the other aspect or portion of the second adjusted read operation. The first read sequence 750 and the second read sequence 850 can be complementary.

The second adjusted read operation can be similar to the first adjusted read operation in adjusting the read sequence according to the accessed polarity data 152 of FIG. 1. However, in accessing the polarity data 152, the memory system 102 of FIG. 1 can access a portion of the codeword or a designated location in the set of targeted cells for the second adjusted read operation instead of the designated SLC utilized in the first adjusted read operation. In other words, the memory system 102 can store the polarity data 152 at a designated portion of corresponding target read location. The memory system 102 can initially read the designated portion and, based on the read polarity data 152, adjust the read operation for accessing the remaining/targeted portion for the stored data.

As an illustrative example, the second adjusted read operation can begin with a polarity read. The polarity read 752 of FIG. 7B and a detection portion 751 of FIG. 7B can correspond to a negative read polarity. The polarity read 852 of FIG. 8B and a detection portion 851 of FIG. 8B can correspond to a positive read polarity.

Referring to FIG. 7B, the memory system 102 (e.g., the memory array 116) can implement the polarity read 752 by performing a fast ramp (e.g., along a negative polarity) for reading the dedicated portion of the codeword/targeted cells for the polarity data 152. When the result of the fast ramp read (e.g., the stored value of the polarity data 152) is negative (e.g., the set (S) state), the memory system 102 can adjust the read sequence and implement the detection portion 751 that first establishes (by, e.g., applying increasing levels of read voltages) read set (S) and then intermediate read state (E4) in negative polarity. In doing so, the initial portion of the first read sequence 750 can act as a first pulse (e.g., reset precondition 1) corresponding to the intermediate state programming.

Subsequently, the detection portion 751 can include a polarity change for reading reset (R) state. The memory system 102 can apply/increase voltages on the positive side. After reading the R state, the first read sequence 750 can include a reprograming voltage 754 that matches the polarity (e.g., positive polarity) used for the R read. The reprograming voltage 754 can correspond to the intermediate/offsetting pulse. The reprograming voltage 754 can increase the applied voltage to a reprogramming level (e.g., 6.5V), which can be greater than the intermediate read voltage (e.g., magnitude of the intermediate read state). The reprograming voltage 754 (e.g., along with the R read) can function as the intermediate reprogramming pulse (e.g., intermediate pulse 2) that establishes the intermediate state on the opposite (e.g., positive) polarity/side at the end of the first read sequence 750. The reprograming voltage 754 can have a controlled pulse width or ramp rate that corresponds to the Vt for the intermediate state.

The reprograming voltage 754 can simultaneously adjust or reprogram the polarity data 152. For example, the reprograming voltage 754 can change the state of the polarity bits at the predetermined portion from the S state (e.g., negative polarity) to the R state (e.g., positive polarity).

Figure 8B:
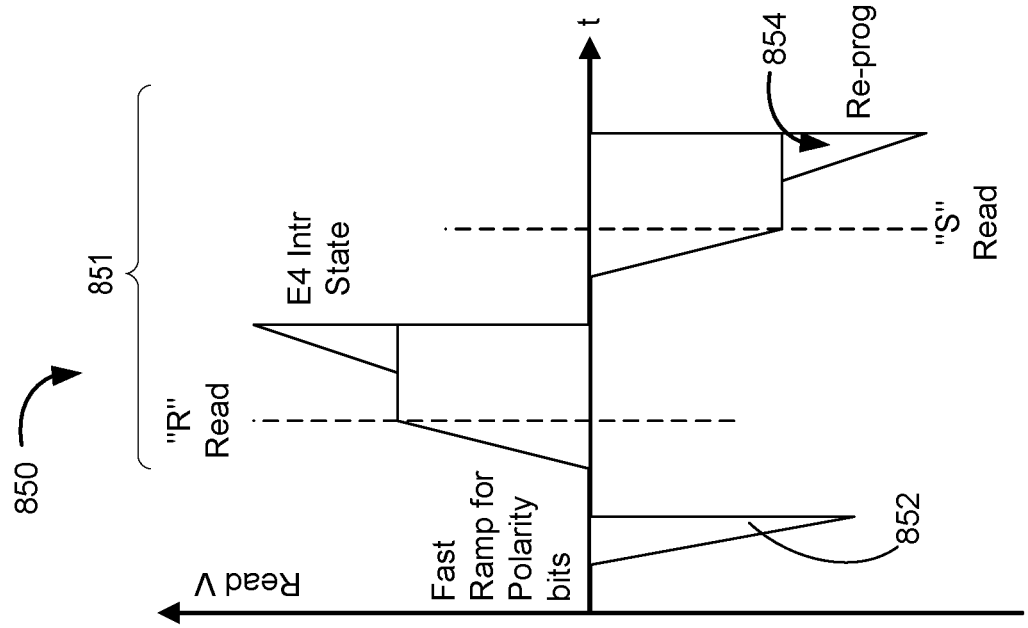
Figure 8A:
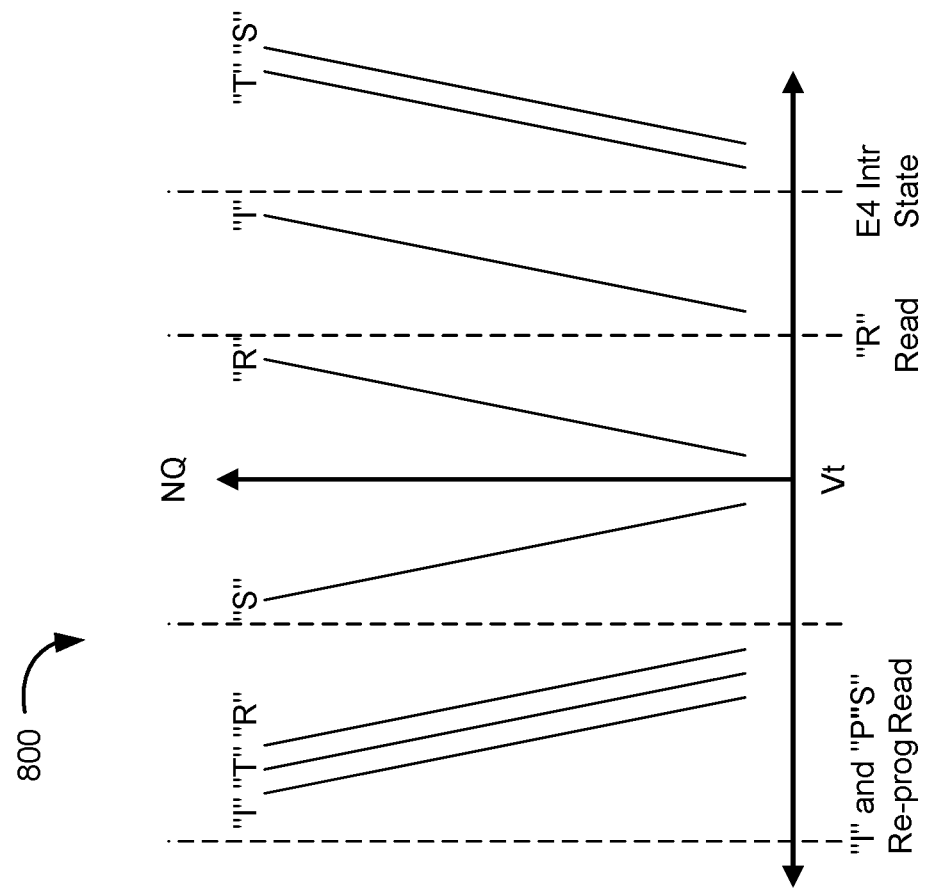

Referring to FIG. 8B, the memory system 102 (e.g., the memory array 116) can implement the polarity read 852 by performing a fast ramp (e.g., along a negative polarity) for reading the dedicated portion of the codeword/targeted cells for the polarity data 152. When the result of the fast ramp read (e.g., the stored value of the polarity data 152) is non-negative (e.g., not in the set (S) state), the memory system 102 can adjust the read sequence and implement the detection portion 851 that first establishes (by, e.g., applying increasing levels of read voltages) read reset (R) state and then intermediate read state (E4) in positive polarity. In doing so, the initial portion of the second read sequence 850 can act as a first pulse (e.g., reset precondition 1) corresponding to the intermediate state programming.

Subsequently, the detection portion 851 can include a polarity change for reading the set (S) state. The memory system 102 can apply/increase voltages on the negative side. After reading the S state, the second read sequence 850 can include a reprograming voltage 854 that matches the polarity (e.g., negative polarity) used for the S read. The reprograming voltage 854 can correspond to the intermediate/offsetting pulse. The reprograming voltage 854 can increase the applied voltage to a reprogramming level (e.g., 6.5V), which can be greater than the intermediate read voltage (e.g., magnitude of the intermediate read state). The reprograming voltage 854 (e.g., along with the S read) can function as the intermediate reprogramming pulse (e.g., intermediate pulse 2) that establishes the intermediate state on the opposite (e.g., negative) polarity/side at the end of the second read sequence 850. The reprograming voltage 854 can have a controlled pulse width or ramp rate that corresponds to the Vt for the intermediate state.

The reprograming voltage 854 can simultaneously adjust or reprogram the polarity data 152. For example, the reprograming voltage 854 can change the state of the polarity bits at the predetermined portion from the R state (e.g., positive polarity) to the S state (e.g., negative polarity).

Figure 9:
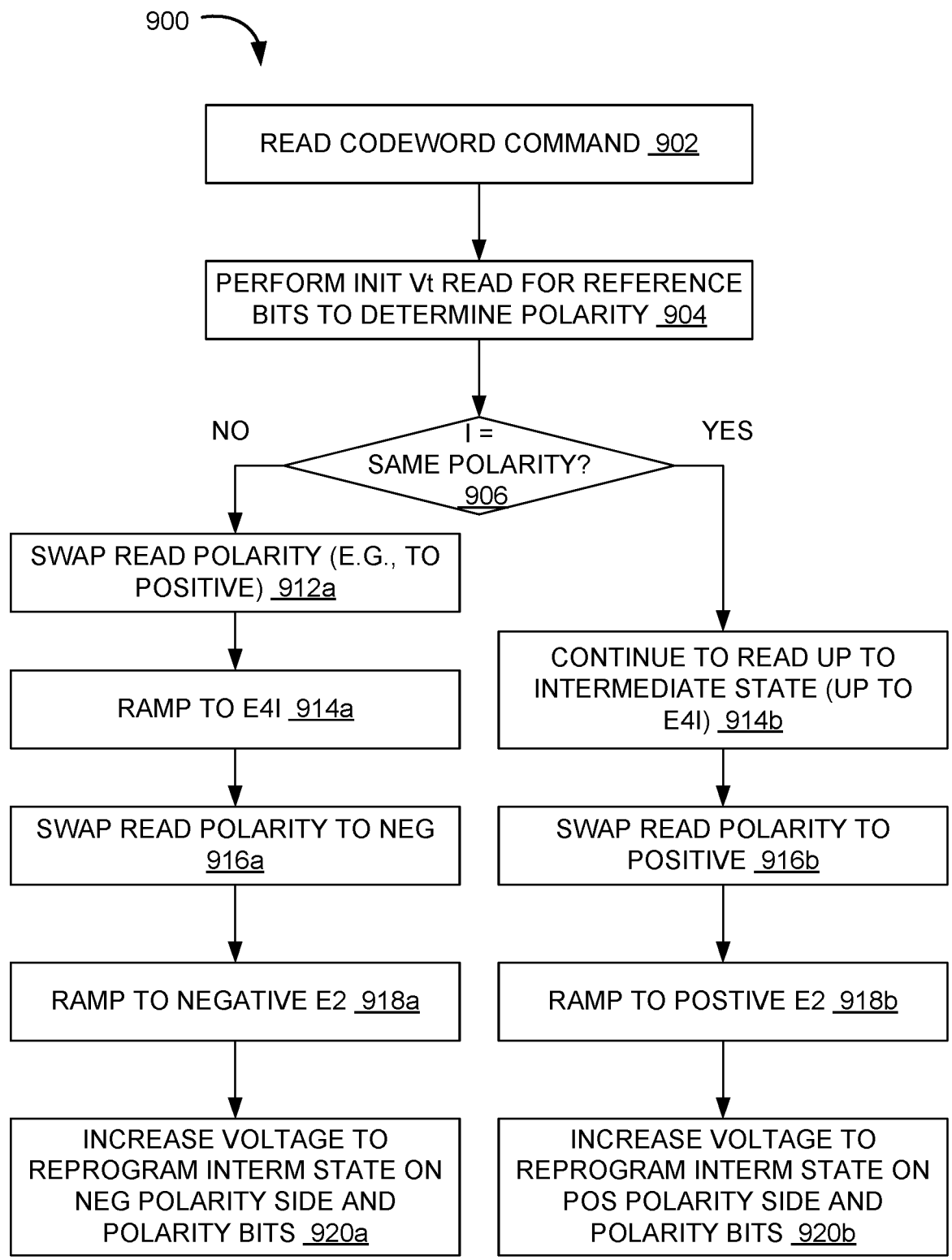
FIG. 9 is a flow diagram illustrating an example method corresponding to the second adjusted read operation in accordance with an embodiment of the present technology.

FIG. 9 is a flow diagram illustrating an example method 900 corresponding to the second adjusted read operation in accordance with an embodiment of the present technology. The method 900 can correspond to the multi-bit read mechanism 150 of FIG. 1. For example, the method 1000 can represent the first read sequence 750 of FIG. 7B and the second read sequence 850 of FIG. 8B for the second adjusted read operation. The memory system 102 of FIG. 1 (e.g., the memory array 116 of FIG. 1) can implement the method 1000 to read the XLC 134 of FIG. 1, such as the MLC 136 of FIG. 1.

At block 902, the memory system 102 can read a codeword command. For example, the memory system 102 (via, e.g., the memory array 116 and/or a processor or a logic circuit local thereto) can receive and process a codeword command, such as for reading a location (e.g., a set of one or more targeted memory cells) specified by the codeword command.

At block 904, the memory system 102 can perform an initial Vt read for the reference bits to determine the polarity. For example, the memory system 100 can implement the polarity read 752 of FIG. 7B or the polarity read 852 of FIG. 8B, such as by performing a fast ramp for negative polarity. Accordingly, the memory array 116 can access the polarity data 152.

At decision block 906, the memory system 102 can evaluate the accessed polarity data 152 to determine whether the intermediate state is in the same polarity as the initial Vt read. In other words, based on the polarity of the initial Vt read, the memory system 102 can determine whether the polarity data 152 indicates a positive read or a negative read. The memory system 102 can adjust the read sequence according to the polarity data 152. In some embodiments, the memory system 102 can adjust the read sequence by adjusting the polarity of the first established read states.

When the polarity data 152 indicates that the intermediate state corresponds to a polarity different from the initial Vt read, the memory system 102 can implement the operations represented in blocks 912*a*, 914*a*, 916*a*, 918*a*, and 920*a* that correspond to the second read sequence 850 of FIG. 8B. The memory array 116 can swap the read polarity to match the polarity indicated by the polarity data 152 as illustrated at block 912*a*. For example, the memory array 116 can swap the read polarity from the negative polarity to the positive polarity.

At block 914*a*, the memory array 116 can implement the initial portion of the second read sequence 850 and ramp the read voltage to the intermediate read state (e.g., E4I). Accordingly, the memory array 116 can establish the read set and intermediate state (e.g., up to the E4 intermediate read state) for positive polarity.

At block 916*a*, the memory array 116 can swap the read polarity (e.g., positive to negative). At block 918*a*, the memory array 116 can ramp the read voltage to the negative E2 state or R read state. At this point, the memory array 116 can identify the initial storage state of the targeted memory cell and communicate the read data.

After the R read and/or concurrent to the read data communication, the memory array 116 can further increase the voltage to reprogram the intermediate state on the initial Vt read polarity (e.g., negative polarity) as illustrated at block 920*a*. Accordingly, the memory array 116 can implement the reprogramming voltage 854 of FIG. 8B using the same/positive polarity as the preceding operation instead of using the separate/dedicated reprogramming pulse 252 of FIG. 2B (e.g., requiring an additional polarity change). The reprograming voltage 854 can simultaneously update or change the polarity data 152 at the reference bits, such as by changing the stored priority data 152 from positive to negative.

When the polarity data 152 indicates that the intermediate state corresponds to a polarity matching the initial Vt read, the memory system 102 can implement the operations represented in blocks 914*b*, 916*b*, 918*b*, and 920*b* that correspond to the first read sequence 750 of FIG. 7B. Since the read polarity (e.g., negative) of the intermediate state matches that of the initial Vt read, the memory array 116 can implement the initial portion of the first read sequence 750 and ramp the read voltage to the intermediate read state (e.g., E4I) as illustrated at block 914*b*. Accordingly, the memory array 116 can establish the read set and intermediate state (e.g., up to the E4 intermediate read state) for negative polarity.

At block 916*b*, the memory array 116 can swap the read polarity (e.g., negative to positive). At block 918*b*, the memory array 116 can ramp the read voltage to the positive E2 state or S read state. At this point, the memory array 116 can identify the initial storage state of the targeted memory cell and communicate the read data.

After the S read and/or concurrent to the read data communication, the memory array 116 can further increase the voltage to reprogram the intermediate state away from the initial Vt read polarity (e.g., away from negative polarity) as illustrated at block 920*b*. Accordingly, the memory array 116 can implement the reprograming voltage 754 of FIG. 7B using the same/positive polarity as the preceding operation instead of using the separate/dedicated reprogramming pulse 252 (e.g., requiring an additional polarity change). The reprograming voltage 754 can simultaneously update or change the polarity data 152 at the reference bits, such as by changing the stored priority data 152 from negative to positive.

Control Flow

Figure 10:
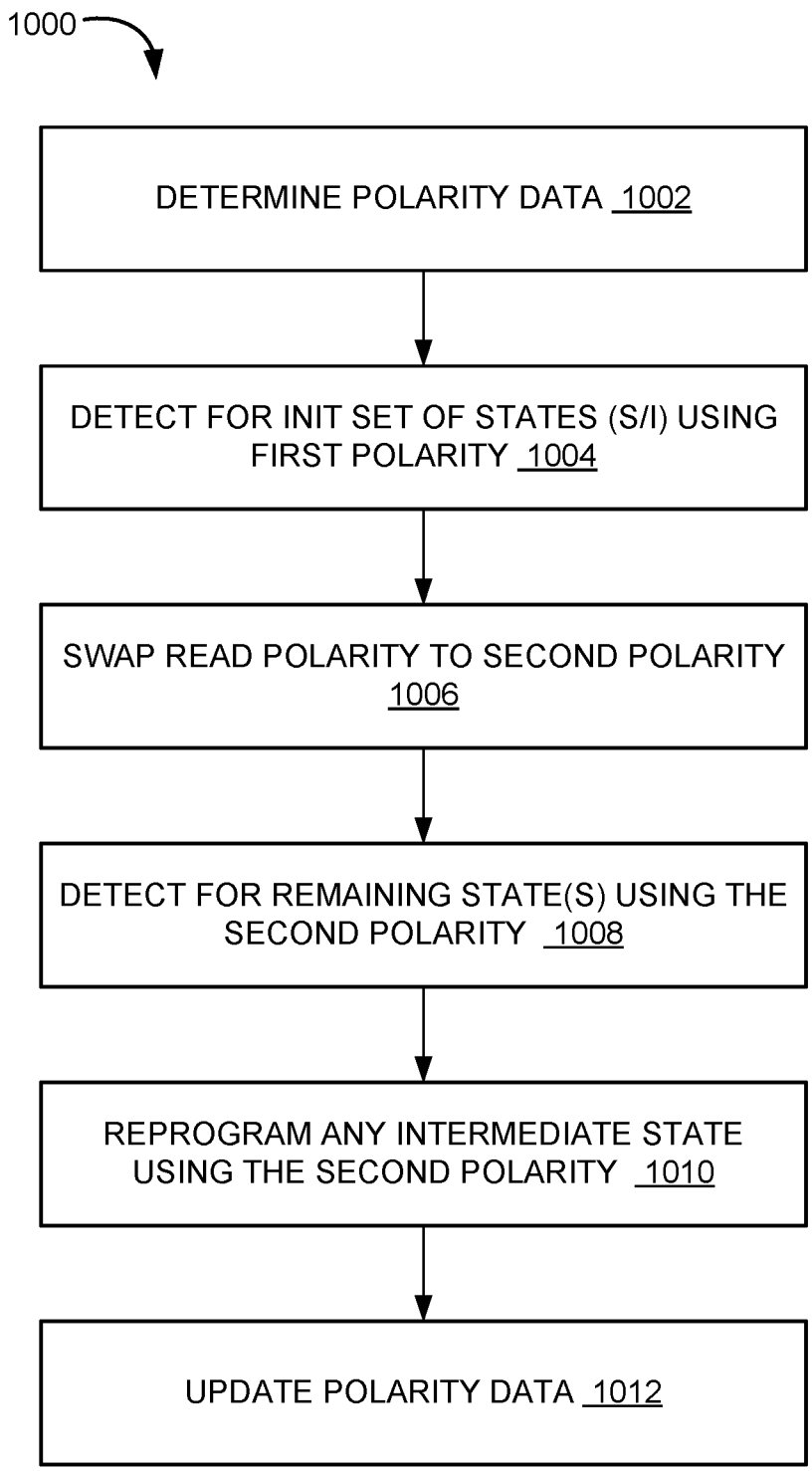
FIG. 10 is a flow diagram illustrating an example method for operating an apparatus in accordance with an embodiment of the present technology.

FIG. 10 is a flow diagram illustrating an example method 1000 for operating an apparatus (e.g., the computing system 100, the memory system 102, the memory array 116, and/or other circuits illustrated in FIG. 1) in accordance with an embodiment of the present technology. The method 1100 can be for implementing the multi-bit read mechanism 150 of FIG. 1, the method 600 of FIG. 6, the method 900 of FIG. 9, or a combination thereof.

At block 1002, the apparatus can determine the polarity data 152 of FIG. 1 associated with a location targeted for a read operation. For example, the apparatus can read the storage management slot as illustrated block 604 of FIG. 6, such as by reading the SLC 132 of FIG. 1 dedicated to storing the polarity data 152 of FIG. 1 for the target location. Also, the apparatus can perform the initial Vt read as illustrated block 1004 of FIG. 10.

The apparatus can detect the storage state (e.g., resistance level or the corresponding voltage/current behavior) at the target location based on the determined polarity data 152. The apparatus can detect the storage state or read the stored data based on applying a sequence of voltage levels for a first polarity and then a second polarity. The apparatus can select the first polarity as the positive polarity or the negative polarity according to the polarity data 152, such as illustrated at determination blocks 606 of FIGS. 6 and/or 1006 of FIG. 10. At block 1004, the apparatus can detect/search for an initial set of read states, including the intermediate state, using the first polarity indicated by the polarity data. For example, the apparatus can apply/ramp the read level voltage along the first polarity, such as illustrated at blocks 612a/b and/or 1014a/b.

At block 1006, the apparatus can swap the read polarity, such as the polarity for the read level voltages used to determine the storage state, from the first polarity to a second polarity. For example, the apparatus can swap the read polarity as illustrated at blocks 614a/b and/or 1016a/b.

At block 1008, the apparatus can detect/search for one or more remaining states using the second polarity. For example, the apparatus can apply/ramp the read level voltage along the second polarity (e.g., the other/non-selected one of the positive or negative polarity), such as illustrated at blocks 616a/b and/or 1018a/b.

At block 1010, the apparatus can reprogram any intermediate state using the second polarity. For example, when the storage state of the target location corresponds to the intermediate state/Vt, the apparatus can apply the reprogramming voltage along the second polarity. The apparatus can reestablish the intermediate state as illustrated at block 618a/b and/or 1020a/b. Accordingly, the apparatus can use the reprogramming voltage to reestablish the intermediate Vt using the second polarity instead of the first polarity.

In some embodiments, the read can disturb or alter the storage state. For example, when the targeted location is initially storing the data corresponding to the intermediate storage state (e.g., along the first polarity as indicated by the polarity data 152), the read operation can be a destructive read that alters/resets the intermediate storage state. The apparatus can use the reprogramming voltage along the second polarity to reestablish the intermediate storage state along the second polarity.

At block 1012, the apparatus can update the polarity data. In some embodiments, the apparatus can update the polarity data separately, such as by reprogramming the dedicated SLC, as illustrated at blocks 620a/b. In other embodiments, the apparatus can update the polarity data using the reprogramming voltage (e.g., simultaneously as reprogramming the intermediate state) as illustrated at blocks 1020a/b. The apparatus can update the polarity data 152 to indicate that the polarity setting or the intermediate state is changed from the first polarity to the second polarity after the detection of the storage state.

Figure 11:
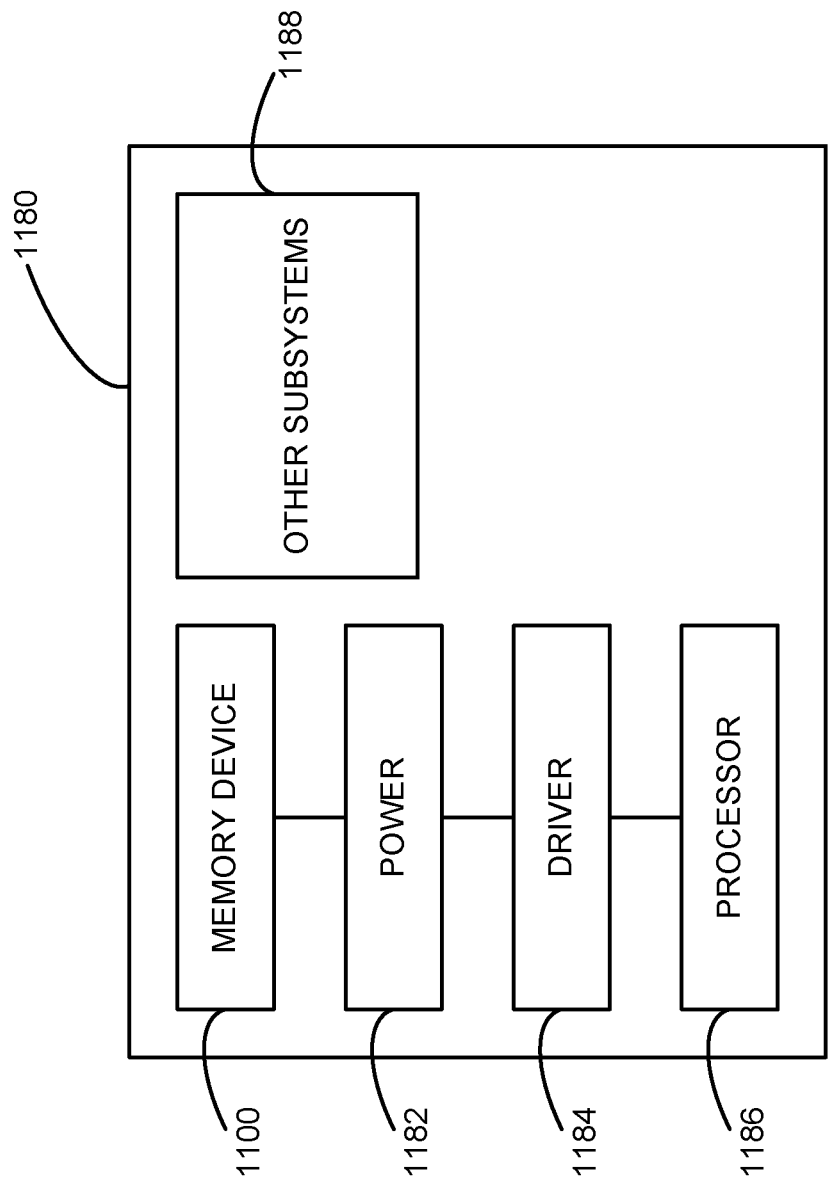
FIG. 11 is a schematic view of a system that includes an apparatus in accordance with an embodiment of the present technology.

FIG. 11 is a schematic view of a system that includes an apparatus in accordance with embodiments of the present technology. Any one of the foregoing apparatuses (e.g., memory devices) described above with reference to FIGS. 1-10 can be incorporated into any of a myriad of larger and/or more complex systems, a representative example of which is system 1180 shown schematically in FIG. 11. The system 1180 can include a memory device 1100, a power source 1182, a driver 1184, a processor 1186, and/or other subsystems or components 1188. The memory device 1100 can include features generally similar to those of the apparatus described above with reference to one or more of the FIGS, and can therefore include various features for performing a direct read request from a host device. The resulting system 1180 can perform any of a wide variety of functions, such as memory storage, data processing, and/or other suitable functions. Accordingly, representative systems 1180 can include, without limitation, hand-held devices (e.g., mobile phones, tablets, digital readers, and digital audio players), computers, vehicles, appliances and other products. Components of the system 1180 may be housed in a single unit or distributed over multiple, interconnected units (e.g., through a communications network). The components of the system 1180 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of NAND Flash devices. Apparatuses configured in accordance with other embodiments of the present technology, however, can include other types of suitable storage media in addition to or in lieu of NAND Flash devices, such as, devices incorporating NOR-based non-volatile storage media (e.g., NAND flash), magnetic storage media, phase-change storage media, ferroelectric storage media, dynamic random access memory (DRAM) devices, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage, or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to one or more of the FIGS. described above.

We claim:
1. A memory device, comprising:
rewritable memory cells including multi-level cells (MLCs) that are each configured to store two bits using a set of storage states that correspond to a minimum threshold voltage (Vt), a maximum Vt, a ternary (T) state, and at least one intermediate (I) state for positive and negative polarities; and
a logic circuit operably coupled to the memory cells and configured to:
determine a polarity data associated with reading a target location amongst the MLCs;
detect a storage state at the target location based on applying a sequence of voltage levels for a first polarity and then a second polarity,
wherein the sequence of the first and second polarity is selected according to the polarity data and is configured to write over an intermediate Vt in distinguishing between the T state and the at least one I state,
wherein the storage state is detected based on adjusting a voltage application sequence to (1) first apply one or more voltage levels matching the first polarity indicated by the polarity data for enabling detection of the intermediate Vt and then (2) one or more voltage levels for the second polarity that is opposite the first polarity, and
wherein the determined polarity data indicates the first polarity representing that the target location is configured to implement the intermediate Vt using the first polarity;
control application of a reprogramming voltage along the second polarity for reestablishing the storage state, wherein the reestablished storage state corresponds to the intermediate Vt,
wherein, when the storage state of the target location corresponds to the intermediate Vt, the reprogramming voltage applied along the second polarity is configured to reestablish the intermediate Vt using the second polarity after the detection of the storage state instead of using the first polarity as was before the detection; and
update the polarity data after detecting the storage state, wherein the polarity data is changed from the first polarity to the second polarity for a subsequent read operation at the target location.

2. The memory device of claim 1, wherein:
the rewritable memory cells include a slot dedicated to store the polarity data for the target location; and
the logic circuit is configured to determine the polarity data based on reading the dedicated slot.

3. The memory device of claim 2, wherein the dedicated slot within the rewritable memory cells is a single-level cell (SLC) configured to store one bit that represents the polarity data.

4. The memory device of claim 1, wherein the logic circuit is configured to:
receive a read address identifying at least the target location along with a polarity location, wherein the read address corresponds to a codeword that includes a dedicated bit at the polarity location for representing the polarity data; and
determine the polarity bit by detecting an established state at the polarity location.

5. The memory device of claim 4, wherein the logic circuit is configured to:
determine the polarity bit by applying a voltage level for detecting a low Vt state along a predetermined one of the positive or the negative polarity; and
select the first polarity according to a detection result of the low Vt.

6. The memory device of claim 5, wherein the logic circuit is configured to select the first polarity as the predetermined polarity used to determine the polarity bit when the low Vt state is detected using the predetermined polarity.

7. The memory device of claim 5, wherein the logic circuit is configured to select the first polarity as a polarity different from the predetermined polarity used to determine the polarity bit when the low Vt state is not detected using the predetermined polarity.

8. The memory device of claim 4, wherein when the storage state of the target location corresponds to the intermediate Vt, the reprogramming voltage applied along the second polarity is configured to simultaneously (1) reestablish the intermediate Vt using the second polarity after the detection of the storage state instead of using the first polarity as was before the detection and (2) update the polarity data from the first polarity to the second polarity for a subsequent read operation at the target location.

9. The memory device of claim 1, wherein the logic device is further configured to:
communicate the storage state or a representation thereof to an external circuit; and
in parallel to the communication, update the polarity data from the first polarity to the second polarity for a subsequent read operation at the target location.

10. An apparatus, comprising:
rewritable memory cells including a subset of cells that are each configured to store more than one bit using a set of storage states that correspond to a minimum threshold voltage (Vt), a maximum Vt, a ternary (T) state, and at least one intermediate (I) state,
wherein the subset of cells are multi-level cells (MLCs) that are each configured to store two bits,
wherein the rewritable memory cells include a single-level cell (SLC) configured to store one bit that represents the polarity data for the target location; and a logic circuit operably coupled to the memory cells and configured to:
  determine a polarity data associated with reading a target location amongst the subset of cells, wherein the polarity data is updated by separately programming the SLC to represent the different value;
  detect a storage state at the target location based on applying a sequence of voltage levels for a first polarity and then a second polarity,
    wherein the sequence of the first and second polarity is selected according to the polarity data and
    wherein applying the sequence of voltage levels results in removing a previously established I state in distinguishing between the T state and the at least one I state;
  control application of a reprogramming voltage along the second polarity for reestablishing the storage state; and
  separate from or simultaneously with application of the reprogramming voltage, update the polarity data after detecting the storage state, wherein the polarity data is updated to a value different than before the detection of the storage state.

11. The apparatus of claim 10, wherein:
  the determined polarity data represents a polarity setting for implementing the intermediate Vt;
  the storage state is detected based on initially applying the voltage levels using the first polarity that matches the polarity setting for enabling detection of the intermediate Vt;
  when the storage state of the target location corresponds to the intermediate Vt, the reprogramming voltage applied along the second polarity is configured to reestablish the intermediate Vt using the second polarity; and
  the polarity data is updated to indicate that the polarity setting is changed from the first polarity to the second polarity after the detection of the storage state.

12. The apparatus of claim 10, wherein the logic circuit is configured to:
  receive a command for reading a codeword that is stored at an address representative of multiple memory cells including the target location, wherein the codeword includes a polarity bit corresponding to the polarity data;
  determine the polarity data based on applying a read level voltage along a predetermined polarity to detect the polarity bit;
  select the first polarity according to a detection result of the polarity bit; and
  update the polarity data using the reprogramming voltage that simultaneously reestablishes the intermediate Vt.

13. A method of operating a memory device that includes rewritable memory cells that are each configured to store more than one bit using a minimum threshold voltage (Vt), a maximum Vt, a ternary (T) state, and at least one intermediate (I) state, the method comprising:
  determining a polarity data associated with reading a target location amongst the subset of cells, wherein the determined polarity data represents a polarity setting for implementing an intermediate Vt at the target location;
  detecting a storage state at the target location based on applying a sequence of voltage levels for a first polarity and then a second polarity,
    wherein the sequence of the first and second polarity is selected according to the polarity data,
    wherein applying the sequence of voltage levels results in removing a previously established I state in distinguishing between the T state and the at least one I state,
  wherein detecting the storage state includes:
    first applying one or more voltage levels of the first polarity, wherein the first polarity matches the polarity setting to enable detection of the intermediate Vt;
    changing a polarity for read level voltages from the first polarity to the second polarity; and
    applying one or more voltage levels of the second polarity;
  controlling application of a reprogramming voltage along the second polarity for reestablishing the storage state,
    wherein, when the storage state of the target location corresponds to the intermediate Vt, controlling the application of the reprogramming voltage includes reestablishing the intermediate Vt at the target location using the second polarity; and
  separate from or simultaneously with application of the reprogramming voltage, updating the polarity data after detecting the storage state, wherein the polarity data is updated to a value different than before the detection of the storage state, wherein the polarity setting is updated from the first polarity to the second polarity after the detection of the storage state.

14. The method of claim 13, wherein:
  the rewritable memory cells include (1) multi-level cells (MLCs) that are each configured to store two bits, wherein the target location is an MLC, and (2) a single-level cell (SLC) configured to store one bit that represents the polarity data for the target location;
  determining the polarity data includes reading the SLC associated with the target location; and
  updating the polarity data includes programming the SLC to store the different value.

15. The method of claim 13, further comprising:
  receiving a command for reading a codeword that is stored across a set of cells including the target location, wherein the codeword includes a polarity bit corresponding to the polarity data;
  selecting the first polarity according to the polarity data; and
  wherein:
    determining the polarity data includes reading the polarity bit using a read voltage level having a predetermined polarity.

16. The method of claim 15, wherein selecting the first polarity includes selecting the first polarity as the predetermined polarity when the polarity bit is detected using the predetermined polarity.

17. The method of claim 15, wherein:
  selecting the first polarity includes selecting the first polarity different from the predetermined polarity when the polarity bit is not detected using the predetermined polarity; and
  detecting the storage state includes:
    changing a polarity for read level voltages from the predetermined polarity to the first polarity; and
    first applying one or more voltage levels of the first polarity, wherein the first polarity matches the polarity setting to enable detection of the intermediate Vt;

changing a polarity for read level voltages from the first polarity to the second polarity, wherein the second polarity matches the predetermined polarity; and applying one or more voltage levels of the second polarity.

\* \* \* \* \*